US009011649B2

(12) United States Patent
Kharchenko et al.

(10) Patent No.: US 9,011,649 B2
(45) Date of Patent: Apr. 21, 2015

(54) THIN FILM DEPOSITION METHOD

(75) Inventors: Andriy Kharchenko, Palaiseau (FR); Anne Durandeau, Paris (FR); Nicolas Nadaud, Paris (FR)

(73) Assignee: Saint-Gobain Glass France, Courbevoie (FR)

( * ) Notice: Subject to any disclaimer, the term of this patent is extended or adjusted under 35 U.S.C. 154(b) by 501 days.

(21) Appl. No.: 13/496,090

(22) PCT Filed: Sep. 30, 2010

(86) PCT No.: PCT/FR2010/052073
§ 371 (c)(1),
(2), (4) Date: Mar. 14, 2012

(87) PCT Pub. No.: WO2011/039488
PCT Pub. Date: Apr. 7, 2011

(65) Prior Publication Data
US 2012/0171439 A1    Jul. 5, 2012

(30) Foreign Application Priority Data
Oct. 1, 2009   (FR) .................................... 09 56866

(51) Int. Cl.
*C23C 14/14* (2006.01)
*C03C 17/00* (2006.01)
*C23C 14/54* (2006.01)
*C03C 17/245* (2006.01)
*C23C 14/18* (2006.01)
*C23C 14/58* (2006.01)
*C23C 14/06* (2006.01)

(52) U.S. Cl.
CPC ............... *C03C 17/002* (2013.01); *C23C 14/14* (2013.01); *C23C 14/541* (2013.01); *C23C 14/0641* (2013.01); *C23C 14/0635* (2013.01); *C03C 17/245* (2013.01); *C03C 2217/71* (2013.01); *C03C 2218/154* (2013.01); *C03C 2218/322* (2013.01); *C23C 14/185* (2013.01); *C23C 14/5813* (2013.01); *C23C 14/5853* (2013.01); *Y10S 977/755* (2013.01); *Y10S 977/891* (2013.01)

(58) Field of Classification Search
None
See application file for complete search history.

(56) References Cited

U.S. PATENT DOCUMENTS

| | | | |
|---|---|---|---|
| 5,938,898 A * | 8/1999 | Ando et al. | ............... 204/192.23 |
| 6,818,309 B1 | 11/2004 | Talpaert et al. | |
| 6,875,319 B2 | 4/2005 | Nadaud et al. | |
| 6,924,037 B1 | 8/2005 | Joret et al. | |
| 7,005,188 B2 | 2/2006 | Anderson et al. | |
| 7,166,360 B2 | 1/2007 | Coustet et al. | |
| 7,737,080 B2 | 6/2010 | Labrousse et al. | |
| 7,884,047 B2 | 2/2011 | Labrousse et al. | |
| 7,923,626 B2 | 4/2011 | Blieske et al. | |
| 7,955,687 B2 | 6/2011 | Nghiem et al. | |
| 7,972,713 B2 | 7/2011 | Fleury et al. | |
| 7,976,909 B2 | 7/2011 | Durandeau et al. | |
| 7,981,516 B2 | 7/2011 | Labrousse et al. | |
| 7,993,503 B2 | 8/2011 | Nadaud et al. | |
| 8,080,108 B2 | 12/2011 | Nadaud et al. | |
| 2001/0000871 A1 | 5/2001 | Moench et al. | |
| 2003/0039842 A1 | 2/2003 | Nakashima et al. | |
| 2003/0113972 A1 | 6/2003 | Hayashi et al. | |
| 2004/0043260 A1 | 3/2004 | Nadaud et al. | |
| 2004/0241406 A1 | 12/2004 | Nadaud et al. | |
| 2006/0165963 A1 | 7/2006 | Fleury et al. | |
| 2006/0201203 A1 | 9/2006 | Labrousse et al. | |
| 2006/0222863 A1 | 10/2006 | Nadaud et al. | |
| 2006/0240266 A1 | 10/2006 | Schicht et al. | |
| 2007/0188871 A1 | 8/2007 | Fleury et al. | |
| 2007/0196695 A1 | 8/2007 | Finley et al. | |
| 2008/0115471 A1 | 5/2008 | Labrousse et al. | |
| 2008/0241479 A1 * | 10/2008 | Nghiem et al. | ................ 428/166 |
| 2008/0261056 A1 | 10/2008 | Labrousse et al. | |
| 2009/0011194 A1 | 1/2009 | Nadaud et al. | |
| 2009/0017314 A1 | 1/2009 | Nadaud et al. | |
| 2009/0104784 A1 * | 4/2009 | Sakashita | ....................... 438/758 |

(Continued)

FOREIGN PATENT DOCUMENTS

| | | |
|---|---|---|
| FR | 2 412 508 | 7/1979 |
| GB | 1 228 786 | 4/1971 |

(Continued)

OTHER PUBLICATIONS

International Search Report Issued Feb. 11, 2011 in PCT/FR10/52073 Filed Sep. 30, 2010.

*Primary Examiner* — Keith Hendricks
*Assistant Examiner* — Timon Wanga
(74) *Attorney, Agent, or Firm* — Oblon, McClelland, Maier & Neustadt, L.L.P.

(57) ABSTRACT

The subject of the invention is a process for obtaining a substrate coated on at least part of its surface with at least one film of oxide of a metal M the physical thickness of which is 30 nm or less, said oxide film not being part of a multilayer comprising at least one silver film, said process comprising the following steps:

at least one intermediate film of a material chosen from the metal M, a nitride of the metal M, a carbide of the metal M and an oxygen-substoichiometric oxide of the metal M is deposited by sputtering, said intermediate film not being deposited above or beneath a titanium-oxide-based film, the physical thickness of said intermediate film being 30 nm or less; and at least part of the surface of said intermediate film is oxidized using a heat treatment, during which said intermediate film is in direct contact with an oxidizing atmosphere, especially air, the temperature of said substrate during said heat treatment not exceeding 150° C.

20 Claims, No Drawings

(56) References Cited

U.S. PATENT DOCUMENTS

| | | |
|---|---|---|
| 2009/0130409 A1 | 5/2009 | Reutler et al. |
| 2009/0202807 A1* | 8/2009 | Takeyama et al. ............ 428/220 |
| 2009/0202817 A1 | 8/2009 | Durandeau et al. |
| 2009/0226735 A1 | 9/2009 | Nadaud et al. |
| 2009/0321246 A1 | 12/2009 | Tsunekawa et al. |
| 2010/0062245 A1 | 3/2010 | Martin et al. |
| 2010/0071810 A1 | 3/2010 | Nadaud et al. |
| 2010/0209673 A1 | 8/2010 | Viasnoff et al. |
| 2010/0313936 A1 | 12/2010 | Nghiem et al. |
| 2011/0056825 A1 | 3/2011 | Baubet et al. |
| 2011/0117293 A1 | 5/2011 | Durandeau et al. |
| 2011/0236663 A1 | 9/2011 | Fleury et al. |
| 2011/0311732 A1 | 12/2011 | Bignon et al. |
| 2012/0087005 A1 | 4/2012 | Reymond et al. |
| 2012/0094075 A1 | 4/2012 | Peter et al. |

FOREIGN PATENT DOCUMENTS

| | | |
|---|---|---|
| JP | 10-199346 A | 7/1998 |
| WO | WO 2005/022624 A1 | 3/2005 |
| WO | 2009 157064 | 12/2009 |

\* cited by examiner

THIN FILM DEPOSITION METHOD

This application is a 371 of PCT/FR2010/052073, filed Sep. 30, 2010. Priority to French patent application 0956866, filed Oct. 1, 2009, is claimed.

The invention relates to the field of inorganic thin films, especially deposited on substrates.

Thin films deposited on substrates are often based on metals, oxides or even nitrides.

One process widely employed on an industrial scale for thin-film deposition, especially on a glass substrate, is sputtering, especially magnetically enhanced sputtering, called in this case magnetron sputtering. In this process, a plasma is created in a high vacuum close to a target comprising the chemical elements to be deposited. The active species of the plasma, by bombarding the target, tear off said elements, which are deposited on the substrate forming the desired thin film. This process is called a "reactive" process when the film is made of a material resulting from a chemical reaction between the elements torn off from the target and the gas contained in the plasma. The major advantage of this process lies in the possibility of depositing, on the same line, a very complex multilayer by making the substrate run in succession beneath various targets, generally in a one and the same device.

It is for example known to deposit titanium oxide films using a target made of metallic titanium in a plasma containing oxygen.

The oxygen contained in the plasma however has the drawback of oxidizing the surface of the metallic target, so much so that the sputter deposition rate is greatly reduced. Generally, it has been observed that the sputter deposition rate of oxide films is much lower than the deposition rate of metals or even of nitrides or carbides.

An aim of the invention is to obtain, by sputtering, metallic oxide films at high deposition rates.

For this purpose, one subject of the invention is a process for obtaining a substrate coated on at least part of its surface with at least one film of oxide of a metal M the physical thickness of which is 30 nm or less, said oxide film not being part of a multilayer of films comprising at least one silver film, said process comprising the following steps:

at least one intermediate film of a material chosen from the metal M, a nitride of the metal M, a carbide of the metal M and an oxygen-substoichiometric oxide of the metal M, is deposited by sputtering, said intermediate film not being deposited above or beneath a titanium-oxide-based film, the physical thickness of said intermediate film being 30 nm or less; and at least part of the surface of said intermediate film is oxidized using a heat treatment, during which said intermediate film is in direct contact with an oxidizing atmosphere, especially air, the temperature of said substrate during said heat treatment not exceeding 150° C.

According to the invention, the oxide is therefore obtained in two steps: first a step of depositing the corresponding metal, nitride or carbide, followed by an oxidation step using a heat treatment. Against all expectations, the localized heating of the intermediate film, when it is in contact with an oxidizing atmosphere, in particular air, has been shown to be capable of oxidizing thin films of relatively large thickness. Generally, at least 80% of the thickness of the intermediate film is oxidized, even all the film in certain cases.

The oxidizing atmosphere is preferably air, especially at atmospheric pressure. If required, the oxygen content of the atmosphere may be increased in order to further promote the oxidation of the intermediate film.

The heat treatment furthermore has the distinction, in contrast to annealing or tempering treatments, of not heating the glass significantly. It is thus not necessary for the substrate to undergo slow controlled cooling before the glass is cut or stored. This process also makes it possible to integrate a heater on existing continuous production lines, more particularly in the space located between the exit of the vacuum deposition chamber of the magnetron line and the device for storing the glass in stack form. It is also possible in certain cases to carry out the treatment according to the invention within the actual vacuum deposition chamber.

The substrate is preferably a sheet of glass, of glass-ceramic, or of an organic polymer. It is preferably transparent, colorless (this may then be a clear or extra-clear glass) or colored, for example blue, green, grey or bronze colored. The glass is preferably soda-lime-silica glass, but it may also be a borosilicate or aluminum borosilicate glass. Preferred organic polymers are polycarbonate or polymethyl methacrylate or even polyethylene terephthalate (PET). The substrate advantageously has at least one dimension larger than or equal to 1 m, even 2 m or even 3 m. The thickness of the substrate generally varies between 0.5 mm and 19 mm, preferably between 0.7 and 9 mm, especially between 2 and 8 mm, even between 4 and 6 mm. The substrate may be flat or curved, even flexible.

The glass substrate is preferably float glass, i.e. capable of being obtained by a process consisting in pouring molten glass onto a bath of molten tin (the float bath). In this case, the film to be treated may equally well be deposited on the "tin" side as on the "atmosphere" side of the substrate. The expressions "atmosphere" and "tin" sides are understood to mean the sides of the substrate having been respectively in contact with the atmosphere above the float bath and in contact with the molten tin. The tin side contains a small superficial amount of tin having diffused into the structure of the glass. The glass substrate may also be obtained by lamination between two rollers, which technique allows in particular patterns to be printed into the surface of the glass.

The metal M is preferably chosen from titanium, tin, zirconium, zinc, tungsten, tantalum, niobium, molybdenum, chromium, nickel, silicon and aluminum. These metals, or if required their nitrides or carbides, have a high absorbance in the near infrared, so much so that films formed from such metals become hot very rapidly in the case of laser treatment or flame treatment, techniques that will be described in greater detail in the following text. The metal M may also be an alloy, especially a binary alloy of the abovementioned metals, for example an alloy of tin and zinc or an alloy of nickel and chromium.

According to a preferred embodiment, the intermediate film is made of titanium, the oxide film obtained after heat treatment being then a photocatalytic titanium oxide film. This process is particularly advantageous because, at the present time, photocatalytic films of titanium dioxide are obtained by a titanium oxide sputtering step, and therefore at particularly slow deposition rates, followed by a heat treatment step intended to crystallize the titanium oxide so as to render it photocatalytic. In the case of the process according to the invention, a metallic titanium film is deposited at very high deposition rates and the heat treatment makes it possible, in a single step, to oxidize the titanium to titanium oxide and to obtain a photocatalytic, and therefore an at least partially crystallized, film. The titanium oxide film is preferably at least partially crystallized in the anatase form, but the rutile phase may also optionally be present. Such photocatalytic films may also be obtained by oxidation of a film of titanium nitride, titanium carbide or oxygen-substoichiometric titanium oxide. The latter is denoted $TiO_x$. The value of x is preferably 1.8 or less, so that the intermediate film absorbs enough of the laser radiation.

Zirconium oxide may for example be obtained by oxidizing an intermediate film made of metallic zirconium or of zirconium nitride. Zinc oxide may especially be obtained by oxidation of an intermediate film of metallic zinc.

The metal M may be pure or doped with other atoms. By way of example, it is possible to dope titanium using transition metals (for example W, Mo, V, Nb), lanthanide ions or noble metals (such as for example platinum or palladium), or else with nitrogen or carbon atoms. Once the titanium has been oxidized to titanium oxide, these various dopants allow either the photocatalytic activity of the material to be increased, or the bandgap of the titanium oxide to be shifted toward wavelengths either near the visible range or lying within this range. Likewise, the silicon may be doped with aluminum, because aluminum is frequently added to silicon targets in order to make them more conductive and therefore to make the sputter deposition easier.

The physical thickness of the or each film of oxide of the metal M is preferably 20 nm or less, especially 15 nm, even 10 nm. To achieve this the physical thickness of the intermediate film is preferably less than or equal to 20 nm, even 15 nm or even 10 nm. The thickness of the intermediate film is however preferably greater than or equal to 2 nm, even 3 or 4 nm. This is because, for very small thicknesses, the absorption of the infrared radiation becomes too weak for sufficiently intense and rapid heating of the film.

The intermediate film may be treated over its entire area, so that after the process the entire surface of the substrate is coated with an oxide film.

Alternatively, only part of the surface of the intermediate film may be heat treated, especially with the aim of producing patterns for esthetic or functional purposes. As explained in greater detail in the following text, the use of a point laser, combined with a system for moving the laser in the plane of the substrate, is particularly suited to this embodiment.

Another subject of the invention is therefore a substrate coated on a part of its area with a film of oxide of a metal M the physical thickness of which is 30 nm or less, and on another part of its area with a film of a material chosen from said metal M, a nitride of said metal M and a carbide of said metal M. Preferably, the oxide film is not part of a multilayer comprising at least one silver film. The oxidized regions may represent for example between 0.1 and 99.9% of the area of the substrate, or between 10 and 90% of the area of the substrate. The oxidized and unoxidized regions are of course located on the same side of the substrate. The oxidized regions may form any sort of design or pattern chosen either for esthetic reasons (drawing, logo, etc.) or for functional reasons.

The metallic or nitride films absorb or reflect in the visible range, whereas the oxide layers are transparent. The oxidizing treatment, when it concerns only certain regions, therefore allows transparent and absorbent regions to be created in a predefined design. For example, mirror films made of chromium or a nickel-chromium alloy may be locally treated so as to create transparent patterns.

Likewise, the metallic films conduct electricity, whereas the oxide films are insulators. The treatment according to the invention may therefore allow conductive regions, therefore electrodes, to be created in a predefined schema, for example in the form of strips or even grids. It is thus possible to create transparent printed circuits, for example by locally oxidizing conductive films made of aluminum or semiconductor films made of silicon.

Preferably, the temperature of the substrate during the heat treatment does not exceed 100° C., especially 50° C. This may especially be the temperature of the side opposite the side on which the intermediate film is deposited. This temperature may be measured for example by pyrometry.

To do this, the oxidizing heat treatment is carried out using a technique that heats the intermediate film very rapidly, so that the substrate is not substantially heated.

In particular, the heat treatment is preferably carried out using at least one laser radiation or using at least one flame (called flame treatment).

These techniques have the advantage of a very high heat transfer coefficient, typically higher than 400 W/(m²·K). The power per unit area of the laser radiation at the intermediate film is preferably greater than or equal to 20 kW/cm² or 30 kW/cm². This very high energy density allows the desired temperature in the intermediate film to be reached extremely rapidly (in general in a time of 1 second or less) and consequently allows the duration of the treatment to be limited correspondingly, the heat generated then not having time to diffuse into the substrate.

Thus, each treated point of the intermediate film is preferably subjected to the oxidizing treatment for a time generally less than or equal to 1 second, even 0.5 seconds. Conversely, the infrared lamps conventionally used for annealing treatments do not allow these high powers per unit area to be reached: the treatment time must be longer to reach the desired temperatures (often several seconds), and the substrate is then necessarily heated to high temperatures by diffusion of the heat, even if the wavelength of the radiation is selected to be absorbed only by the thin film and not by the substrate.

By virtue of the very high heat transfer coefficient associated with the process according to the invention, even the part of the glass located 0.5 mm from the intermediate film is generally not subjected to temperatures higher than 100° C.

The process is generally a continuous process: the intermediate film and the heating means (for example laser beam or flame device) are moved relative to each other so as to treat the desired area, in general the entire area.

The laser radiation preferably has a wavelength between 500 and 2000 nm, especially between 530 and 1200 nm. This is because in this wavelength range the absorbance of the metals, nitrides or carbides is maximized. The radiation is therefore absorbed specifically by the intermediate film and little by the underlying substrate, thereby allowing the intermediate film to be rapidly heated without heating the substrate.

Preferably the absorbance of the intermediate film at the wavelength of the laser radiation is 20% or higher, especially 30%. By way of example, the absorbance of a 10 nm film of titanium or zirconium reaches 40% at a wavelength of 808 nm. In contrast, glass, especially clear or extra-clear glass, absorbs very weakly in this wavelength range so much so that the radiation contributes in heating only the film. The absorbance is defined as being equal to 100% from which the transmittance and the reflectance of the film are subtracted.

Preferably, laser diodes, emitting for example at a wavelength of about 808 nm, 880 nm, 940 nm or even 980 nm or 1032 nm, are used. In the form of systems of diodes, very high powers may be obtained, possibly reaching powers per unit area, at the film to be treated, of higher than 20 kW/cm², even 30 kW/cm².

For an even simpler implementation, the lasers employed in the context of the invention may be fiberized, meaning that the laser radiation is injected into an optical fiber and then delivered near the area to be treated by a focusing head. The laser may also be a fiber laser, in the sense that the amplifying medium is itself an optical fiber.

The laser beam may be a point laser beam, in which case it is necessary to provide a system for moving the laser beam in the plane of the substrate. This embodiment is particularly preferred when only part of the surface of the intermediate film is to be heat treated so as to produce patterns for esthetic or functional purposes. The point laser beam may be moved in an x-y plane and create all sorts of patterns or designs by transforming absorbent and/or reflecting and/or electrically conductive regions into transparent and/or electrically insulating regions.

The laser radiation preferably comes from at least one laser beam forming a line (also called a "line laser" in the following text) that simultaneously irradiates all or some of the width of the substrate. This embodiment is preferred in the case where it is desired to treat the entire surface of the substrate, because it avoids the use of expensive movement systems, which are generally bulky and difficult to maintain. The line-laser beam may especially be obtained using systems of high-power laser diodes combined with focusing optics. The thickness of the line is preferably between 0.01 and 1 mm. The length of the line is typically between 5 mm and 1 m. The profile of the line may especially be a Gaussian curve or a top hat.

The line laser, which simultaneously irradiates all or part of the width of the substrate, may be composed of a single line (irradiating therefore the entire width of the substrate) or a plurality of optionally separate lines. When a plurality of lines is used, it is preferable that they be placed so that the entire area of the multilayer is treated. The, or each line is preferably placed perpendicularly to the run direction of the substrate, or placed obliquely thereto. The various lines may treat the substrate simultaneously, or in a delayed manner. The important point is that the entire area to be treated is treated.

In order to treat the entire area of the film, the substrate coated with the film and the or each line laser are preferably moved relative to one another. The substrate may thus be moved, especially so as to run translationally facing the stationary line laser, generally beneath, but optionally above the line laser. This embodiment is of particular note for a continuous treatment. Alternatively, the substrate may be stationary and the laser may be moved. Preferably the difference between the respective speeds of the substrate and laser is greater than or equal to 1 meter per minute, even 4 meters per minute and even 6, 8, 10 or 15 meters per minute, thereby ensuring a high treatment rate.

When the substrate is moved, especially translationally, it may be moved using any mechanical conveying means, for example belts, rollers, or trays running translationally. The conveying system allows the run speed to be controlled and regulated. If the substrate is made of a flexible organic polymer, it may be moved using a film advance system in the form of a succession of rollers.

The laser may also be moved so as to adjust its distance to the substrate, which may be useful in particular when the substrate is curved, but not solely. Indeed, it is preferable for the laser beam to be focused on the coating to be treated so that the latter is located less than 1 mm from the focal plane. If the system for moving the substrate or laser is not sufficiently precise with respect to the distance between the substrate and the focal plane, it is preferable to be able to adjust the distance between the laser and the substrate. This adjustment may be automatic, especially regulated using a distance measurement upstream of the treatment.

When the line laser is moved, it is necessary to provide a system for moving the laser, located above or beneath the substrate. The duration of the treatment is regulated by the run speed of the line laser.

Of course, all relative positions of the substrate and the laser are possible provided that the area of the substrate can be suitably irradiated. Most generally, the substrate will be placed horizontally, but it may also be placed vertically, or at any possible inclination. When the substrate is placed horizontally, the laser is generally placed so as to irradiate the top side of the substrate. The laser may also irradiate the underside of the substrate. In this case it is necessary for the substrate support system, and optionally the substrate conveying system when the substrate is moving, to let the radiation pass into the region to be irradiated. This is the case for example when conveying rollers are used: the rollers being separate, it is possible to place the laser in a region located between two successive rollers.

When both sides of the substrate are to be treated, it is possible to employ a number of lasers located on either side of the substrate, whether the latter is in a horizontal, vertical or any inclined position.

The laser, especially the line laser, may be integrated into a film deposition line, for example magnetically enhanced sputtering (magnetron) line. In general, the line includes substrate handling devices, a deposition unit, optical control devices and stacking devices. For example, the substrates run on conveyor rollers, in succession in front of each device or each unit.

The laser is preferably located just after the film deposition unit, for example at the exit of the deposition unit. The coated substrate may thus be treated in line after the film has been deposited, at the exit of the deposition unit and before the optical control devices, or after the optical control devices and before the substrate stacking devices.

The laser may also be integrated into the deposition unit. For example, the laser may be introduced into one of the chambers of a sputtering deposition unit. The laser may also be placed outside the deposition unit, but in such a way that a substrate located inside said unit may be treated. To achieve this, all that is required is to provide a window transparent to the wavelength of the radiation used, through which the laser beam would pass in order to treat the film. It is thus possible to treat a film before the subsequent deposition of another film in the same unit. So as not to impede the oxidation of the intermediate film, it is possible to treat the multilayer in a special chamber, in which the oxidizing atmosphere is controlled.

Whether the laser is outside or integrated into the deposition unit, these "flow" processes are preferable to a batch process in which it would be necessary to stack the glass substrates between the deposition step and the heat treatment.

However, batch processes may however be of interest in the case where the heat treatment according to the invention is carried out in a different location to the deposition, for example in a location where the glass is converted. The radiation device may therefore be integrated into lines other than the film deposition line. For example, it may be integrated into a multiple glazing (especially double or triple glazing) manufacturing line or into a laminated glazing manufacturing line. In these various cases, the heat treatment according to the invention is preferably carried out before the multiple or laminated glazing is assembled.

The laser may be replaced with any device emitting infrared radiation and focused onto the substrate, for example using mirrors or lenses, so as to obtain sufficient power per unit area.

The flame treatment is preferably carried out by at least one flame treatment device located perpendicularly to the run direction of the substrate, or along any relatively oblique direction. A number of elementary devices may be combined to form a single device. The total length of the flame treatment device is preferably at least equal to the width of the coated substrate, thereby easily allowing on-the-run treatment without requiring a movement system.

In general, at least one burner is used. The or each burner may be an external combustion burner, in the sense that the fuel and the oxidant are mixed in the nozzle of the burner or in an extension of the nozzle. In this case, the substrate is subjected to the action of a flame. The burner may also be an internal combustion burner, in the sense that the fuel and the oxidant are mixed inside the burner: the substrate is then subjected to the action of hot gases. All the intermediate cases are of course possible, in the sense that only part of the combustion may take place inside the burner, and the other part outside. Certain burners, in particular hot air burners, which use air as the oxidant, possess premix chambers in which all or some of the combustion takes place. In this case, the substrate may be subjected to the action of a flame and/or hot gases. Oxy-fuel burners, which use pure oxygen, generally do not contain a premix chamber. The hot gases may also be produced using a plasma torch: the heat is not produced by a combustion reaction, but by ionization between the electrodes of the torch.

The gas used may be a mixture of an oxidizing gas, especially chosen from air, oxygen or mixtures thereof, and a combustible gas, especially chosen from natural gas, propane, butane, even acetylene or hydrogen, or mixtures thereof. Oxygen is preferred as the oxidizing gas, in particular in combination with natural gas (methane) or propane, on the one hand because it allows higher temperatures to be reached and consequently shortens the treatment, stopping the substrate from heating up, and on the other hand because it prevents production of nitrous oxides $NO_x$.

In order to reach the desired temperatures in the intermediate film, the coated substrate is generally positioned within the visible flame, especially in the hottest zone of the flame, a part of the visible flame then extending around the treated region.

The temperature of the hot gases is preferably between 1300 and 2200° C., especially between 1300 and 1700° C. in the case of hot air burners. The velocity of the hot gases is preferably between 5 and 100 meters per second.

The oxide film obtained according to the invention may be the only film deposited on the substrate, or it may belong to a multilayer. In the latter case, the film may especially be the last film of the multilayer.

When the oxide film is a photocatalytic titanium oxide film, the latter is normally the last film of the multilayer deposited on the substrate, in other words the film of the multilayer furthest removed from the substrate. This is because it is important for the photocatalytic film to be in contact with the atmosphere and its pollutants. It is however possible to deposit on the photocatalytic film a very thin, generally discontinuous or porous, film. This may for example be a film based on noble metals intended to increase the photocatalytic activity of the material. This may also be a thin hydrophilic film, for example made of silica, as taught in patent applications WO 05/040058 or WO 07/045805. A sublayer, intended to prevent migration of alkali metal ions from the substrate toward the titanium oxide film, may be placed between the substrate and the photocatalytic film. By way of example, this may especially be a film based on an oxide, nitride, oxynitride, or even oxycarbide of silicon or aluminum, or even based on tin or zirconium oxide. However, since the heat treatment according to the invention is of short duration and does not heat the glass to high temperatures, the migration of alkalis is greatly reduced, so much so that the alkali metal migration barrier film is not absolutely necessary. A sublayer may however be useful in the case where the substrate might have to undergo a subsequent heat treatment, such as tempering or bending. It is also possible to provide, beneath the titanium-oxide based film, a sublayer that promotes the crystal growth of titanium oxide, especially in the anatase form. This may especially be a $ZrO_2$ sublayer, as described in patent application WO 02/40417, or even a sublayer promoting the heteroepitaxial growth of titanium oxide in the anatase form, as described for example in patent application WO 05/040058, especially a film made of $BaTiO_3$ or $SrTiO_3$. The titanium oxide film may also be the last film of a low-E and/or solar-control multilayer. The film in this case allows the appearance of condensation (misting and/or icing) on the external surface of the glazing to be limited, in particular when the substrate is integrated into double or triple glazing, especially inclined glazing (for example in roofs or verandas). The presence of a low-E film on the external side of the glazing limits heat exchange with the exterior during the night, and therefore keeps the surface temperature of the glass above the dew point. The appearance of misting or icing is therefore greatly reduced or even completely prevented.

When the oxide film is a zirconium oxide film, it may be employed for its corrosion- and scratch-resistance properties.

A film based on tungsten oxide may be used to produce blue wall cladding.

The substrate obtained according to the invention is preferably incorporated into a glazing unit. The glazing may be single glazing or multiple (especially double or triple) glazing, in the sense that it may comprise a plurality of glass sheets housed in a gas-filled space. The glazing may also be laminated and/or tempered and/or toughened and/or curved.

The side of the substrate opposite the side on which the oxide film is deposited, or if required one side of another substrate of the multiple glazing, may be coated with another functional film or a multilayer comprising functional films. This may especially be a photocatalytic film. There may also be films or multilayers having a thermal function, especially solar-control or low-E functions, for example multilayers comprising a silver film protected by dielectric films. This may also be a mirror film, especially based on silver. There may finally be a lacquer or enamel intended to make the glazing opaque so as to form therefrom a cladding panel (also called wall cladding) for a curtain wall. The wall cladding is placed in the curtain wall next to transparent glazing and allows curtain walls made entirely of glass, and uniform from the esthetic point of view, to be obtained.

Other films or multilayers located on the side of the substrate opposite the side on which the oxide film is deposited may see their properties improved using the heat treatment according to the invention. There may especially be properties associated with a better crystallization of functional films, for example silver films. It has thus been observed, in particular in the case of glass substrates at most 6 mm in thickness, that the oxidizing heat treatment according to the invention may also reduce the emissivity and/or resistivity of low-E multilayers containing at least one silver film.

According to a preferred embodiment of the invention, an intermediate film made of metallic titanium is therefore deposited on one side of the substrate and, on the other side of said substrate, a low-E multilayer comprising at least one silver film is deposited, then said intermediate film is treated using at least one laser radiation so that the emissivity or resistivity of the low-E multilayer is reduced by at least 3%. The improvements in emissivity or resistivity are at least 3%, even 5% and even 10%. Thus, using a single heat treatment it is possible to improve the emissivity properties of a low-E multilayer and obtain a photocatalytic film. This is made possible by the fact that the laser radiation is absorbed only partially by the intermediate film and the substrate, so that the low-E multilayer located on the other side receives part of the energy of the radiation, which is used to improve the crystallization properties of the or each silver film. The product obtained possesses a self-cleaning photocatalytic function on one side, which will therefore be sooner directed toward the exterior of a building, and a thermal insulation function on the other side, which will therefore be sooner directed toward the interior of the building.

The invention is illustrated using the nonlimiting exemplary embodiments which follow:

EXAMPLE 1

In this example, a 5 or 10 nm thick intermediate film of metallic titanium was deposited on a clear soda-lime-silica glass substrate.

The intermediate film was deposited by sputtering a titanium target with an argon plasma.

The specimens were treated in air using a line laser emitting radiation at a wavelength of 808 nm, past which the coated substrate ran translationally at speeds ranging from 3 to 20 meters per minute.

The photocatalytic activity was measured in the following way, by monitoring the degradation of stearic acid:

5×5 cm² specimens were cut;
the specimens were cleaned for 45 minutes under UV irradiation and under a stream of oxygen;
the infrared spectrum was measured by FTIR for wavenumbers between 4000 and 400 cm$^{-1}$, in order to form a reference spectrum;
stearic acid was deposited: 60 microliters of a stearic acid solution, dissolved at 10 g/l of stearic acid in ethanol, was deposited by spin coating onto the specimen;
the infrared spectrum was measured by FTIR and the area of the stretch bands of $CH_2$—$CH_3$ bonds between 3000 and 2700 cm$^{-1}$ was measured;
exposure to UVA radiation: the received power per specimen, about 35 W/m² so as to simulate outdoor exposure, was controlled by a photoelectric cell within the 315 to 400 nm wavelength range; and
the photodegradation of the stearic acid film was monitored by measuring the area of the stretch bands of $CH_2$—$CH_3$ bonds, between 3000 and 2700 cm$^{-1}$, after successive exposure times of 30 minutes twice and then one hour.
the photocatalytic activity was defined by the slope, expressed in cm$^{-1}$·min$^{-1}$, of the straight line representing the area of the stretch bands of $CH_2$—$CH_3$ bonds between 3000 and 2700 cm$^{-1}$ as a function of the UV exposure time, for a time between 0 and 30 minutes.

The photocatalytic activity of the films obtained was about 4 to 5×10$^{-3}$ cm$^{-1}$·min$^{-1}$ for run speeds ranging from 4 to 15 meters per minute. The photocatalytic activities were similar to those obtained for a 10 nm thick film of $TiO_2$ deposited by sputtering and then annealed using conventional means. The titanium film had therefore been well oxidized and had crystallized into an active phase, especially the anatase phase.

The photocatalytic activity reduced at the highest run speeds (20 meters per minute), evidence of imperfect oxidation.

EXAMPLE 2

In this example, a 5 nm thick intermediate film of metallic titanium was deposited on a clear soda-lime-silica glass substrate.

The intermediate film was deposited by sputtering a titanium target with an argon plasma.

The coated substrate was treated by a flame using, as oxidant, a mixture of air (1500 L/min) and oxygen (163 L/min) and, as fuel, natural gas (214 L/min). The distance between the substrate and the nozzle of the burner was 12 mm.

A treatment at a speed of 3 meters per minute allowed a photocatalytic activity of 5×10$^{-3}$ cm$^{-1}$·min$^{-1}$ to be obtained.

EXAMPLE 3

Depending on the test, a 5 nm or 10 nm thick intermediate film of metallic zirconium was deposited on a clear soda-lime-silica glass substrate.

The intermediate film was deposited by sputtering a zirconium target with an argon plasma.

The specimens were treated in air using a line laser emitting radiation at a wavelength of 980 nm, past which the coated substrate was run translationally, at speeds of several meters per minute.

The treatment oxidized the zirconium film into zirconium oxide, the film becoming perfectly transparent.

EXAMPLE 4

The substrates used in the case of example 3 were also flame treated, in the same way as in example 2.

The metallic zirconium film was thus oxidized to zirconium oxide, the film becoming perfectly transparent.

EXAMPLE 5

Depending on the test, a 5 nm or 10 nm thick intermediate film of metallic zirconium nitride was deposited on a clear soda-lime-silica glass substrate.

A flame treatment identical to that described in example 2 allowed a perfectly transparent zirconium oxide film to be obtained.

The invention claimed is:

1. A process for producing a coated substrate, the process comprising:
   (I) depositing, by sputtering, at least one material selected from the group consisting of a metal M, a nitride of the metal M, a carbide of the metal M, and an oxygen-substoichiometric oxide of the metal M on at least part of a surface of a substrate, to obtain an intermediate film having a physical thickness of 30 nm or less on the substrate surface, wherein the intermediate film is not deposited above or beneath a titanium-oxide-based film; and
   (II) heat treating the intermediate film while directly contacting at least part of a surface of the intermediate film with an oxidizing atmosphere, to obtain oxide film comprising the metal M and having a physical thickness of 30 nm or less on the substrate surface,
   wherein a temperature of the substrate during the heat treatment does not exceed 150° C.,
   wherein the oxide film is not part of a multilayer comprising a silver film, and
   wherein the heat treating is carried out with laser radiation and a power per unit area of the laser radiation at the intermediate film is greater than or equal to 20 kW/cm².

2. The process of claim 1, wherein the substrate is a sheet comprising glass.

3. The process of claim 1, wherein the metal M is selected from the group consisting of titanium, tin, zirconium, zinc, tungsten, tantalum, niobium, molybdenum, chromium, nickel, silicon, and aluminum.

4. The process of claim 3, wherein the intermediate film comprises metallic titanium, and the oxide film is a photocatalytic titanium oxide film.

5. The process of claim 1, wherein a physical thickness of the oxide film is 20 nm or less.

6. The process of claim 1, wherein a temperature of the substrate during the heat treatment does not exceed 100° C.

7. The process of claim 1, wherein the heat treatment is carried out with laser radiation having a wavelength between 500 and 2000 nm.

8. The process of claim 1, wherein the power per unit area of the laser radiation at the intermediate film is greater than or equal to 30 kW/cm$^2$.

9. A process for producing a coated substrate, the process comprising:
(I) depositing, by sputtering, at least one material selected from the group consisting of a metal M, a nitride of the metal M, a carbide of the metal M, and an oxygen-substoichiometric oxide of the metal M on at least part of a surface of a substrate, to obtain an intermediate film having a physical thickness of 30 nm or less on the substrate surface, wherein the intermediate film is not deposited above or beneath a titanium-oxide-based film; and
(II) heat treating the intermediate film while directly contacting at least part of a surface of the intermediate film with an oxidizing atmosphere, to obtain oxide film comprising the metal M and having a physical thickness of 30 nm or less on the substrate surface,
wherein a temperature of the substrate during the heat treatment does not exceed 150° C.,
wherein the oxide film is not part of a multilayer comprising a silver film, and
wherein the heat treating is carried out with laser radiation from a laser beam, which forms a line that simultaneously irradiates all or part of a width of the substrate.

10. The process of claim 9, wherein the coated substrate and the line formed from the laser beam are moved relative to one another, so that a difference between the respective speeds of the substrate and the laser beam is 4 meters per minute or higher.

11. The process of claim 4, further comprising, before (II):
depositing a low-E multilayer comprising a silver film on a first side of the substrate,
wherein the intermediate film comprising metallic titanium is on a second side of the substrate, and
wherein the intermediate film is heat treated with laser radiation, to reduce an emissivity or resistivity of the low-E multilayer by at least 3%.

12. A process for producing a coated substrate, the process comprising:
(I) depositing, by sputtering, at least one material selected from the group consisting of a metal M, a nitride of the metal M, a carbide of the metal M, and an oxygen-substoichiometric oxide of the metal M on at least part of a surface of a substrate, to obtain an intermediate film having a physical thickness of 30 nm or less on the substrate surface, wherein the intermediate film is not deposited above or beneath a titanium-oxide-based film; and
(II) heat treating the intermediate film while directly contacting at least part of a surface of the intermediate film with an oxidizing atmosphere, to obtain oxide film comprising the metal M and having a physical thickness of 30 nm or less on the substrate surface,
wherein a temperature of the substrate during the heat treatment does not exceed 150° C.,
wherein the oxide film is not part of a multilayer comprising a silver film, and
wherein only part of the surface of the intermediate film is heat treated, to obtain a pattern.

13. The process of claim 1, wherein the oxidizing atmosphere is air.

14. The process of claim 1, wherein a physical thickness of the oxide film is 15 nm or less.

15. The process of claim 1, wherein a temperature of the substrate during the heat treatment does not exceed 50° C.

16. The process of claim 9, wherein the laser radiation has a wavelength between 500 and 2000 nm.

17. The process of claim 10, wherein a difference between the respective speeds of the substrate and the laser beam is 6 meters per minute or higher.

18. The process of claim 9, wherein the substrate is a sheet comprising glass.

19. The process of claim 9, wherein the metal M is selected from the group consisting of titanium, tin, zirconium, zinc, tungsten, tantalum, niobium, molybdenum, chromium, nickel, silicon, and aluminum.

20. The process of claim 19, wherein the intermediate film comprises metallic titanium, and the oxide film is a photocatalytic titanium oxide film.

* * * * *